United States Patent
Sommer

(10) Patent No.: US 7,259,607 B2
(45) Date of Patent: Aug. 21, 2007

(54) INTEGRATED SEMICONDUCTOR MEMORY WITH CLOCK GENERATION

(75) Inventor: Michael Bernhard Sommer, Raubling (DE)

(73) Assignee: Infineon Technologies AG, Neubiberg (DE)

( * ) Notice: Subject to any disclaimer, the term of this patent is extended or adjusted under 35 U.S.C. 154(b) by 64 days.

(21) Appl. No.: 11/217,676

(22) Filed: Sep. 2, 2005

(65) Prior Publication Data

US 2006/0049862 A1    Mar. 9, 2006

(30) Foreign Application Priority Data

Sep. 6, 2004    (DE) .................. 10 2004 043 035

(51) Int. Cl.
*G06F 1/04*    (2006.01)

(52) U.S. Cl. .................. 327/291; 327/294; 327/37

(58) Field of Classification Search ............. 327/291, 327/293, 294, 31, 34, 38, 379, 551, 37
See application file for complete search history.

(56) References Cited

U.S. PATENT DOCUMENTS

| | | | | |
|---|---|---|---|---|
| 5,001,374 A | * | 3/1991 | Chang | 327/552 |
| 5,254,960 A | * | 10/1993 | Hikichi | 331/46 |
| 5,289,060 A | * | 2/1994 | Elnashar et al. | 327/552 |
| 5,539,337 A | * | 7/1996 | Taylor et al. | 326/94 |
| 5,748,034 A | * | 5/1998 | Ketineni et al. | 327/551 |
| 6,009,039 A | | 12/1999 | Takemae et al. | 365/233 |
| 6,285,625 B1 | | 9/2001 | Vogley | 365/233 |
| 6,389,086 B1 | * | 5/2002 | Le et al. | 375/350 |
| 6,535,057 B2 | * | 3/2003 | Chakravarthy | 327/551 |
| 6,621,359 B2 | * | 9/2003 | Lee et al. | 331/57 |
| 6,861,877 B2 | * | 3/2005 | Shiah | 327/34 |
| 2001/0048341 A1 | | 12/2001 | Chakravarthy | 327/551 |
| 2003/0098724 A1 | | 5/2003 | Nishizono | 327/94 |

* cited by examiner

*Primary Examiner*—Kenneth B. Wells
*Assistant Examiner*—Hai L. Nguyen
(74) *Attorney, Agent, or Firm*—Edell, Shapiro & Finnan, LLC

(57) ABSTRACT

An integrated semiconductor memory includes a clock generator circuit driven by an external clock signal and a control circuit driven by the external clock signal. The clock generator circuit generates an internal clock signal with a first level if the external clock signal level lies above a sensitivity level of the clock generator circuit for at least the duration of a sensitivity time of the clock generator circuit, and generates the internal clock signal with a second level if the external clock signal level lies below the sensitivity level for at least the duration of the sensitivity time of the clock generator circuit. The control circuit controls the clock generator circuit such that the control circuit selects the sensitivity time of the clock generator circuit in response to characteristics of the external clock signal.

21 Claims, 6 Drawing Sheets

INTEGRATED SEMICONDUCTOR MEMORY WITH CLOCK GENERATION

BACKGROUND

In integrated semiconductor memories, for example DRAM (Dynamic Random Access Memory) semiconductor memories, memory operations are generally triggered upon rising and falling edges of clock signals. For this purpose, the integrated semiconductor memory is driven with an external clock signal by a memory controller. The external clock signal is fed to a clock generator circuit in the semiconductor memory. The clock generator circuit generates, from the clock signals fed to it externally, an internal clock signal having a higher frequency and phase stability than the external clock signal.

FIG. 4 shows an integrated semiconductor memory 100 having a clock generator circuit 10 for generating an internal clock signal Cint. The integrated semiconductor memory has a clock terminal T100a for application of an external clock signal Cext and a clock terminal T100b for application of a reference signal Vref. The external clock signal Cext and the reference signal Vref are fed to the clock generator circuit 10 via input terminals E10a and E10b connected to the clock terminals T100a and T100b. After evaluation of the two signals, the clock generator circuit 10 generates the internal clock signal Cint at an output terminal A10, said internal clock signal being fed to a control circuit 20. The control circuit 20 is connected to a control terminal S100 of the integrated semiconductor memory via an input terminal E20. For the purpose of storing data and for the purpose of reading out data, the control circuit 20 is driven with external control signals at the control terminal S100. In this case, the external control signals are read in and evaluated by the control circuit 20 synchronously with respect to rising and falling edges of the internal clock signal Cint. The integrated semiconductor memory furthermore has an address register 30, which, on the input side, is connected to an address terminal A100 for application of address signals AS. The address signals AS are buffer-stored in the address register 30 and fed to the control circuit 20.

For a read and write access, the control circuit 20 evaluates the address signals AS upon rising and falling clock edges of the internal clock signal Cint and drives memory cells SZ associated with the addresses in a memory cell array 40. Two memory cells SZ, designed as DRAM memory cells, are illustrated by way of example in the memory cell array 40. The DRAM memory cells SZ have a storage capacitor SC that can be conductively connected to a bit line BL via a selection transistor AT. In order to read out a data value from the memory cell or in order to write a data value to the memory cell, the selection transistor is turned on by means of a signal on a word line WL that is generated by the control circuit 20. In the event of a read access, the memory information is read out via the bit line BL at a data terminal DIO. In the event of a write access, a data value to be written in is applied to the data terminal DIO and written to the memory cell via the bit line BL.

FIG. 5 illustrates the functioning of the clock generator circuit 10. The diagrams in each case show the profile of a voltage amplitude U of external and internal clock signals against a time t.

The first diagram of FIG. 5 shows the profile of an external clock signal Cext1. In this case, the voltage amplitude fluctuates between a high first clock signal level PE1 and a low second clock signal level PE2 during a pulse duration TD.

The second diagram of FIG. 5 shows the profile of the internal clock signal Cint generated by the clock generator circuit 10 in the case of driving with the external clock signal Cext1 of the first diagram of FIG. 5. In this case, the voltage amplitude of the internal clock signal fluctuates between a first high level PI1 and a second low level PI2. If the voltage amplitude of the external clock signal Cext1 exceeds a sensitivity level Vref of the clock generator circuit 10, the clock generator circuit 10 generates the internal clock signal with the high level PI1. If, by contrast, the voltage amplitude of the external clock signal Cext1 falls below the sensitivity level Vref (crossing point), the clock generator circuit 10 generates the internal clock signal with the low level PI2.

A sensitivity time TE of the clock generator circuit 10 is furthermore depicted in the first diagram of FIG. 5. In this case, the sensitivity time TE is the time for which the voltage amplitude of the external clock signal must be present at least at the clock generator circuit 10 in order that the clock generator circuit 10 can generate the first or second level of the internal clock signal Cint. A change in the amplitude of the external clock signal above or below the value of the reference signal is thus interpreted by the clock generator circuit 10 as a change between the two levels of the internal clock signal PI1 and PI2 only when the external clock signal assumes an amplitude value above or below the reference signal Vref at least for the time period of the sensitivity time TE.

The third diagram of FIG. 5 shows an external clock signal Cext2 having a lower signal/noise ratio than the external clock signal Cext1. The fourth diagram of FIG. 5 shows the profile of the internal clock signal Cint if the clock generator circuit 10 is driven by the noisy signal level of the external clock signal Cext2 of diagram 3. The internal clock signal Cint exhibits a plurality of changes between the high and low level of the internal clock signal PI1 and PI2 in particular at the rising and falling edges F1 and F2 of the external clock signal Cext2. These high-frequency changes in the internal clock signal arise by virtue of the fact that the signal amplitude of the noisy external clock signal Cext2, in the region of the rising and falling edges, repeatedly lies above and below the level of the reference signal Vref. The input noise (jitter) of the external clock signal thereby leads to an uncontrolled switching behavior of the internal chip logic.

FIG. 6 shows an embodiment of the clock generator circuit 10 corresponding to the prior art. The clock generator circuit is designed as a differential amplifier connected between a terminal V10a for application of a supply voltage VDD and a terminal V10b for application of a reference voltage VSS. The differential amplifier has a first input transistor 13, which is connected by its control terminal to the input terminal E10a of the clock generator circuit, and a second input transistor 14, which is connected by its control terminal to the input terminal E10b of the clock generator circuit.

In contrast to the simplified embodiment of the clock generator circuit of FIG. 4, the differential amplifier in FIG. 6 is driven by a first external clock signal CLK and an external clock signal /CLK complementary thereto. Such driving is generally used in a computer application if the integrated semiconductor memory is driven by a memory controller, for example. The clock generator circuit generates a low to high or high to low level transition if the profile of the amplitude of the first external clock signal CLK intersects the profile of the amplitude of the second external clock signal /CLK (crossing point). A current source 17b generates a current I at a common terminal GS of the input transistors 13 and 14. Furthermore, the input transistors 13 and 14 are connected via an active load comprising the transistors 15 and 16, which are connected up as a current mirror, to the terminal V10a for application of the supply voltage VD. On the output side, the differential amplifier generates an output signal DS, which is fed to a latch 18. The latch comprises two feedback inverters 19a and 19b connected to the output terminal A10 of the clock generator circuit 10. The inverter 19a generates the high or low level of the internal clock signal Cint on the output side. It is generally designed as an amplifier having a high gain, whereas the inverter 19b is designed as an amplifier having a low gain. The feedback via the inverter 19b acts as a positive feedback. The positive feedback prevents the changeover of the differential amplifier in the event of momentary amplitude fluctuations of the input clock signal CLK.

The circuit described makes it possible to significantly reduce the generation of undesired clock signal transitions of the internal clock signal on account of a noisy external input clock signal. However, the disadvantage of this solution to the problem lies in the positive feedback, which leads to a reduced sensitivity of the differential amplifier with regard to level fluctuations of the external clock signal at its input terminals E10a and E10b. In the case of weak external clock signals having a low high level or a high low level, the high-low or low-high transitions of the external clock signal are no longer identified by the differential amplifier. Furthermore, the frequency of the internal clock signal which can be generated by means of the differential amplifier 10 is limited by the intensity of the feedback. The clock generator circuit is thereby slowed down.

It is also disadvantageous that the so-called duty cycle of the clock generator circuit, which characterizes the ratio of high/low times becomes highly process-dependent as a result of the positive feedback. Changes in the saturation current of the p-channel and/or n-channel transistors of the inverters 19a and 19b cause the feedback of the high and low levels to have different intensities in the case of the positive feedback. The duty cycle for weak or very high-frequency external clock signals is considerably impaired as a result.

The process dependence of the feedback also has a problematic effect in particular when the differential amplifier 10, as shown in FIG. 4, is driven at its second input transistor 14 by a constant reference signal Vref rather than by the complementary external clock signal /CLK. Integrated semiconductor memories are driven by a constant level of a reference signal at one of the clock terminals by test systems for test purposes, in particular.

SUMMARY OF THE INVENTION

The object of the present invention is to specify an integrated semiconductor memory in which the generation of an internal clock signal of a clock generator circuit is adapted to a quality factor of the external clock signal. A further object of the present invention is to specify a method for operating an integrated semiconductor memory in which the generation of an internal clock signal is adapted to the quality factor of an external clock signal.

The object is achieved with regard to the integrated semiconductor memory by means of an integrated semiconductor memory having a clock terminal for application of an external clock signal, which assumes a clock signal level. The integrated semiconductor memory furthermore comprises a clock generator circuit, which is driven by the external clock signal for the generation of an internal clock signal. The clock generator circuit is designed in such a way that it generates the internal clock signal with a first level if the clock signal level of the external clock signal lies above a sensitivity level of the clock generator circuit and it is driven by the clock signal level of the external clock signal at least for the duration of a sensitivity time of the clock generator circuit. In this case, the clock generator circuit is designed in such a way that it generates the internal clock signal with a second level if the clock signal level of the external clock signal lies below the sensitivity level and it is driven by the clock signal level of the external clock signal at least for the duration of a sensitivity time of the clock generator circuit. Moreover, the integrated semiconductor memory has a control circuit for controlling the clock generator circuit, which is driven by the external clock signal. According to the invention, the control circuit is designed in such a way that it alters the sensitivity time of the clock generator circuit.

The clock generator circuit thus reacts to fluctuations of the external clock signal exclusively when the clock signal level of the external clock signal lies above or below the sensitivity level of the clock generator circuit at least for the duration of the sensitivity time. According to the invention, the sensitivity time of the clock generator circuit can be altered. If the sensitivity time of the clock generator circuit is set to be short, the clock generator circuit reacts with a change in the level of the internal clock signal that it generates if it is driven by momentary level fluctuations of the external clock signal above or below its sensitivity level. By contrast, if the sensitivity time of the clock generator circuit is set to be long, it reacts merely with changes in the internal clock signal level if it is driven by long-term external clock signal fluctuations. A high-frequency jitter superposed on the external clock signal is thus not converted into internal clock signal level changes by the clock generator circuit.

In accordance with one development of the integrated semiconductor memory according to the invention the control circuit can be driven by a first external clock signal and by a second external clock signal. In this case, the first external clock signal has a higher signal/noise ratio than the second external clock signal. According to the invention, the control circuit is designed in such a way that it shortens the sensitivity time of the clock generator circuit in the case of driving with the first external clock signal and lengthens the sensitivity time of the clock generator circuit in the case of driving with the second external clock signal.

In accordance with one development of the integrated semiconductor memory according to the invention, the first external clock signal has a higher frequency and phase stability than the second external clock signal. The control circuit is designed in such a way that it shortens the sensitivity time of the clock generator circuit in the case of driving with the first external clock signal and lengthens the sensitivity time of the clock generator circuit in the case of driving with the second external clock signal.

In the case of driving of the integrated semiconductor memory with an external clock signal which exhibits high quality, that is to say is distinguished by a large signal/noise ratio or a high frequency and phase stability, the sensitivity time of the clock generator circuit is shortened by the control circuit. The clock generator circuit thus reacts more rapidly to fluctuations of the external clock signal. This means that it generates a low internal clock signal level, for example, if it is driven by a very momentary fluctuation of the external clock signal that lies below its sensitivity level. Conversely, it generates a high internal clock signal level if it is driven by a momentary fluctuation of the external clock signal level that lies above its sensitivity level. Consequently, a high-frequency, non-noisy external clock signal can be converted into a high-frequency internal clock signal.

If the integrated semiconductor memory is driven by an external clock signal of poor quality, that is to say for example by an external clock signal with a small signal/noise ratio or a low frequency and phase stability, then the control circuit lengthens the sensitivity time of the clock generator circuit. This ensures that the clock generator circuit does not follow undesired level fluctuations, such as occur in the case of a noisy external clock signal, with internal clock signal level changes. Only longer-term changes in the external clock signal level above or below its sensitivity level are converted into internal clock signal level changes by the clock generator circuit. This prevents a high-frequency noise superposed on the external clock signal from leading to an undesired switching behavior of the clock generator circuit.

In particular when testing an integrated semiconductor memory, the latter is driven with an external clock signal of poor quality by a test system. This external clock signal is generally distinguished by a low frequency besides the small signal/noise ratio and the low frequency and phase stability. In accordance with another embodiment of the invention, therefore, the control circuit evaluates the external clock signal by which it is driven with regard to the frequency of said signal. If it is driven by an external clock signal with a low frequency, that is to say for example by the noisy external clock signal that is prescribed by a tester, it lengthens the sensitivity time of the clock generator circuit. High-quality clock signals are generally generated with a high frequency by a memory controller, for example. According to the invention, therefore, the control circuit is designed in such a way that it shortens the sensitivity time of the clock generator circuit in the case of driving with an external clock signal having a high frequency.

In accordance with another embodiment of the integrated semiconductor memory, the clock generator circuit has a first clock circuit and a second clock circuit. The first clock circuit has a shorter sensitivity time than the second clock circuit. The clock generator circuit is designed in such a way that it generates the internal clock signal by means of the first clock circuit if the control circuit is driven by the first external clock signal, and it generates the internal clock signal by means of the second clock circuit if the control circuit is driven by the second external clock signal.

According to a further feature of the invention, the clock generator circuit has a differential amplifier. The differential amplifier comprises a first input transistor, a second input transistor and a controllable current source connected to a common terminal of the first and second input transistors. In this embodiment, the clock generator circuit is designed in such a way that the controllable current source generates a high current at the common terminal of the first and second input transistors if the control circuit is driven by the first external clock signal. The controllable current source generates a low current at the common terminal of the first and second input transistors if the control circuit is driven by the second external clock signal.

A method for generating a clock signal for operating an integrated semiconductor memory, which likewise solves the problem, is specified below.

Provision is made of an integrated semiconductor memory, which can be driven by an external clock signal, which assumes a clock signal level. The integrated semiconductor memory has a first clock circuit having a first sensitivity time and a sensitivity level, in which the first clock circuit generates, on the output side, an internal clock signal with a first level if it is driven at least for the duration of the first sensitivity time by the clock signal level of the external clock signal, which lies above the sensitivity level of the first clock circuit, and generates an internal clock signal with a second level if it is driven at least for the duration of the first sensitivity time by the clock signal level of the external clock signal, which lies below the sensitivity level of the first clock circuit. Furthermore, the integrated semiconductor memory comprises a second clock circuit having a second sensitivity time and a sensitivity level, in which the second clock circuit generates, on the output side, the internal clock signal with the first level if it is driven at least for the duration of the second sensitivity time by the clock signal level of the external clock signal, which lies above the sensitivity level of the second clock circuit, and generates an internal clock signal with a second level if it is driven at least for the duration of the second sensitivity time by the clock signal level of the external clock signal, which lies below the sensitivity level of the second clock circuit. In this case, the first sensitivity time of the first clock circuit is intended to be less than the second sensitivity time of the second clock circuit. The integrated semiconductor memory can be driven by a first external clock signal with a high frequency and a second external clock signal with a low frequency. The method according to the invention then provides for the setting of a control bit in a register with a first state. The integrated semiconductor memory is subsequently driven with the first external clock signal. The control bit that is set with the first state has the effect of activating the first clock circuit for the generation of the internal clock signal. The method according to the invention furthermore provides for the setting of the control bit in the register with a second state. The integrated semiconductor memory is subsequently driven by the second external clock signal. The second state of the control bit then has the effect of activating the second clock circuit for the generation of the internal clock signal.

In accordance with another embodiment of the method according to the invention for generating a clock signal for operating an integrated semiconductor memory, provision is made of an integrated semiconductor memory, which can be driven by an external clock signal. The integrated semiconductor memory has a clock generator circuit comprising a differential amplifier with a controllable current source for generating a current that is fed into the differential amplifier. According to the invention, the integrated semiconductor memory is driven with an external clock signal. The frequency of the external clock signal is subsequently evaluated. The current that is fed into the differential amplifier by the controllable current source is increased if the frequency of the external clock signal lies above a frequency threshold. Conversely, the current that is fed into the differential amplifier by the controllable current source is decreased if the frequency of the external clock signal lies below the frequency threshold.

Further embodiments relating to the integrated semiconductor memory and the method for generating a clock signal for operating the integrated semiconductor memory can be gathered from the subclaims.

BRIEF DESCRIPTION OF THE DRAWINGS

The invention is explained in more detail below with reference to the figures showing exemplary embodiments of the present invention. In the figures.

DETAILED DESCRIPTION

Figure 1:
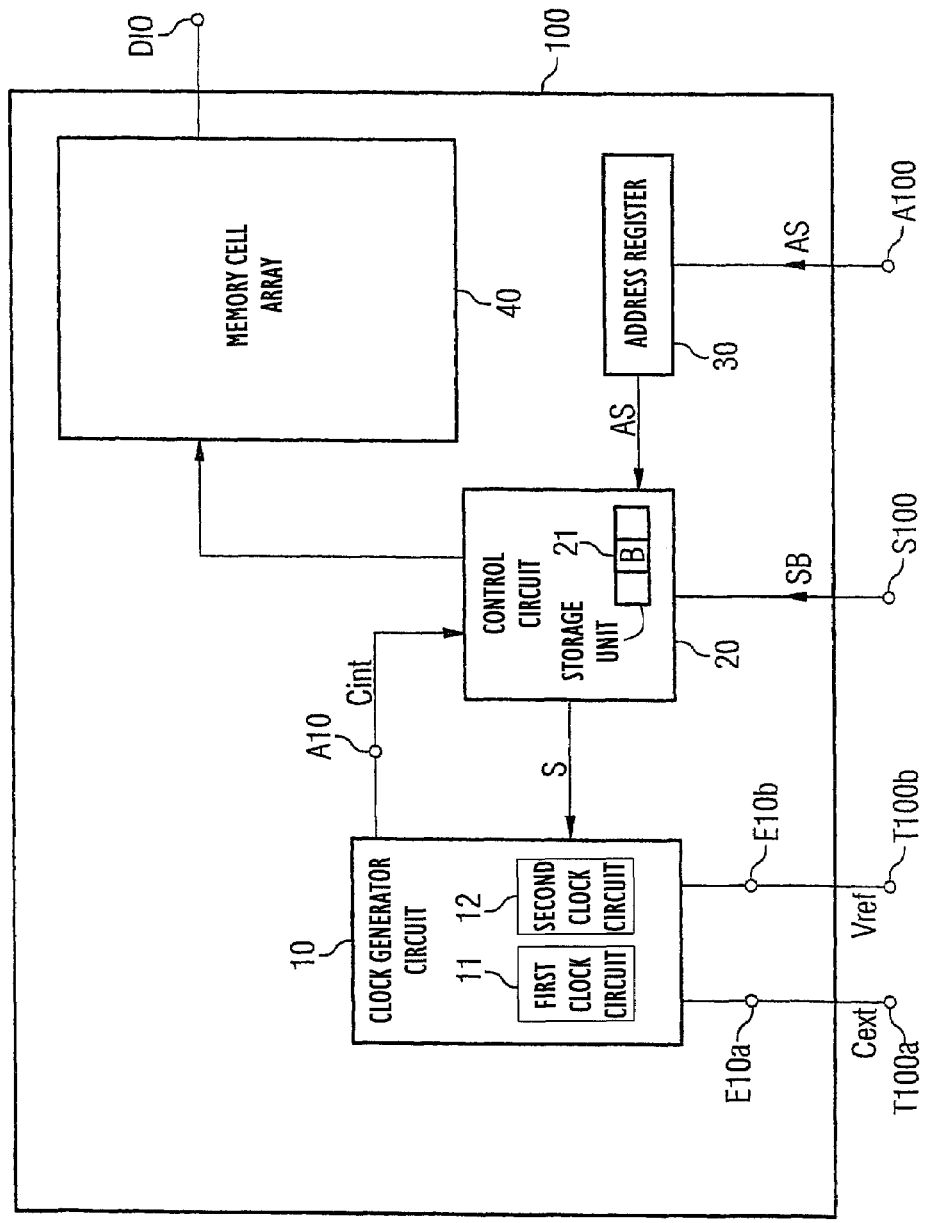
FIG. 1 shows a first embodiment of an integrated circuit for generating an internal clock signal according to the invention.
Figure 2:
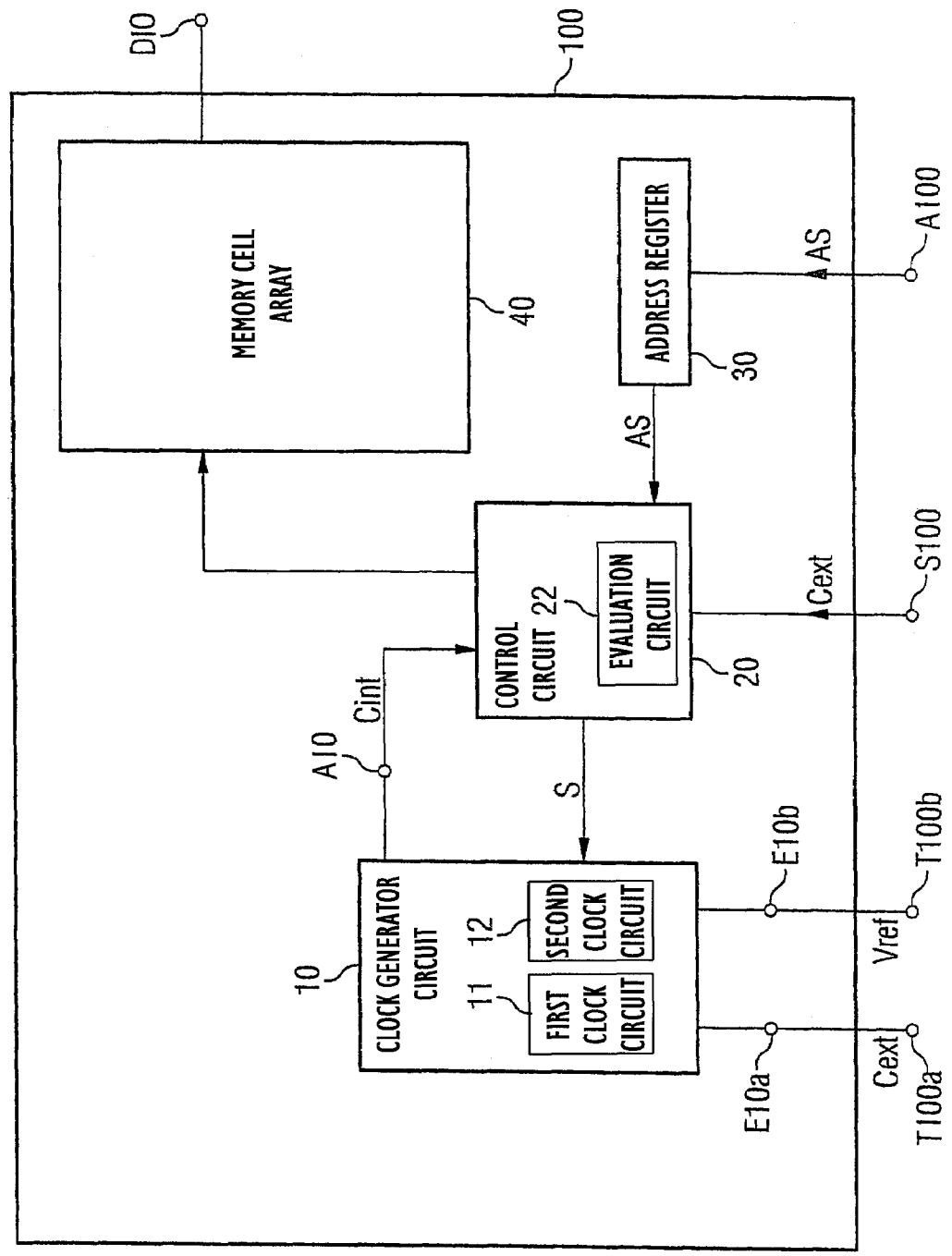
FIG. 2 shows a second embodiment of an integrated circuit for generating an internal clock signal according to the invention.
Figure 3:
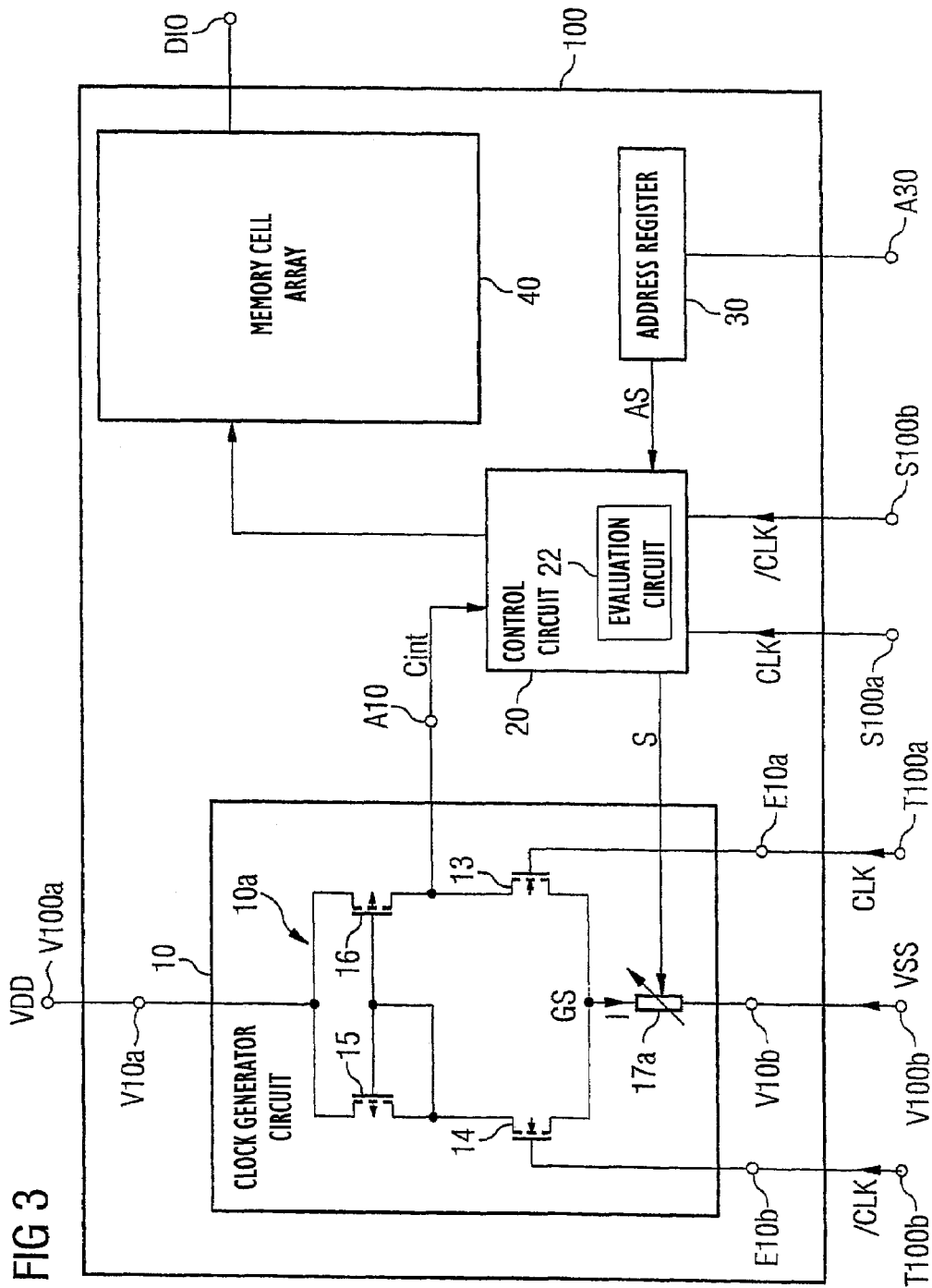
FIG. 3 shows a third embodiment of an integrated circuit for generating an internal clock signal according to the invention.
Figure 4:
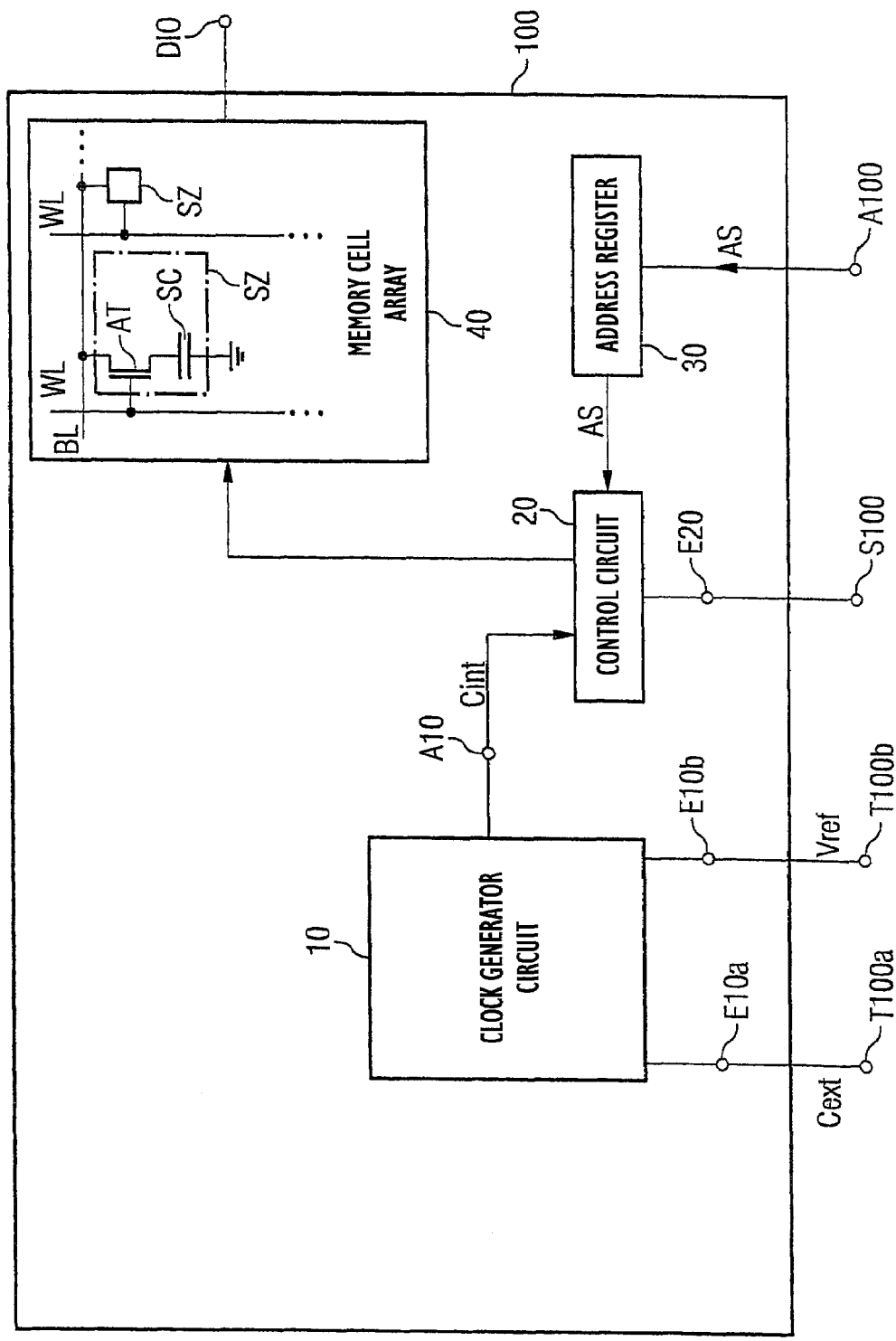
FIG. 4 shows an embodiment of an integrated circuit for generating an internal clock signal according to the prior art.
Figure 5:
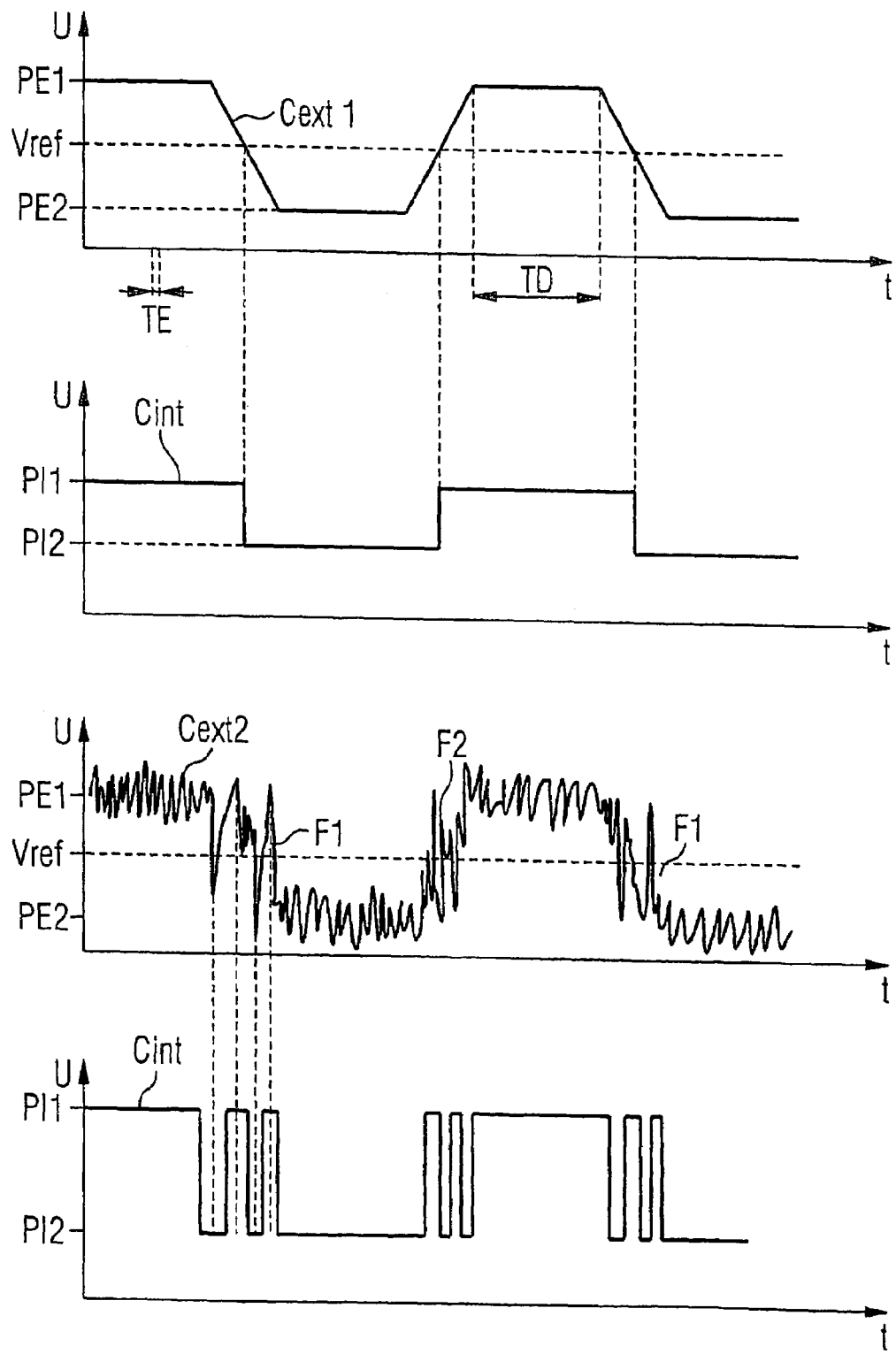
FIG. 5 shows temporal profiles of external and internal clock signals of an integrated semiconductor memory.

The integrated semiconductor memories of FIGS. 1, 2 and 3 have the address register 30—already described in FIG. 4—for buffer-storing addresses AS and also the memory cell array 40 with memory cells into which data can be read via a data terminal DIO and from which data can be read out at the data terminal DIO. For the functioning of these circuit components, reference is made to the explanations with regard to FIG. 4.

FIG. 1 shows a first embodiment of an integrated semiconductor memory for generating an internal clock signal according to the invention. The integrated semiconductor memory has a clock generator circuit 10 and a control circuit 20 besides the address register 30 and the memory cell array 40. The clock generator circuit 10 is connected via a first input terminal E10a and a second input terminal E10b to an external clock terminal T100a for application of an external clock signal Cext and via a second input terminal E10b to a clock terminal T100b of the integrated semiconductor memory for application of a sensitivity level Vref. The clock generator circuit 10 comprises a first clock circuit 11 and a second clock circuit 12.

The first clock circuit 11 has a shorter sensitivity time that the second clock circuit 12. Since the sensitivity time is that time for which the clock generator circuit 10 must be driven at least with a high or low level of the external clock signal in order, on the output side, to generate the internal clock with the first level PE1 or the second level PE2, the second clock circuit only reacts to slow changes in the level of the external clock signal Cext. By contrast, the first clock circuit reacts, by virtue of its shorter sensitivity time, to momentary fluctuations of the external clock signal Cext between the high level PE1 and the low level PE2.

The first clock circuit 11 is preferably used when the integrated semiconductor memory is driven by an external clock signal with a large signal/noise ratio and a high frequency and phase stability. The first clock circuit 11 is thus used when the integrated semiconductor memory is driven by an external clock signal with a high quality factor. These are, in particular, external clock signals which are generated with a high frequency, for example by a memory controller in a computer application.

Conversely, the second clock circuit 12 is used for generating the internal clock if the integrated semiconductor memory is driven by an external clock signal with a small signal/noise ratio and a low frequency and phase stability. This is the case in particular when the integrated semiconductor memory is driven by a test system with a low frequency for example for test purposes.

The first and second clock circuits generate the internal clock signal Cint at an output terminal A10 of the clock generator circuit 10, which feeds said signal to the control circuit 20 for controlling the internal chip logic.

The control circuit 20 has a storage unit 21, for example a storage register. In the storage register, which is preferably designed as a mode register or an extended mode register in the case of a DRAM semiconductor memory, it is possible to store a control bit B with a first state, for example the state 1, or a second state, for example the state 0. In a manner dependent on the state of the control bit B, the control circuit 20 drives the clock generator circuit 10 with a control signal S. If the control bit has the logic state 1, for example, the control circuit generates the control signal with a first state on the output side. If, by contrast, the control bit B with the second state is stored in the storage unit 21, the control circuit 20 drives the clock generator circuit 10 with a second state of the control signal S. If the clock generator circuit is driven by the first state of the control signal S, it selects the first clock circuit 11 for generating the internal clock signal Cint, whereas it selects the second clock circuit 12 for generating the internal clock signal Cint in the case of driving with the second state of the control signal S. The control bit can be stored with the first or second state in the storage unit 21 by application of a control signal SB to the control terminal S100 of the control circuit 20.

If the integrated semiconductor memory is operated for example in a computer application and is driven by a memory controller which generally prescribes an external clock signal with a high frequency, a large signal/noise ratio and also a high frequency and phase stability, then the memory controller writes the control bit B to the storage register 21 with the first state prior to the activation of the semiconductor memory for a read and write access. If, by contrast, the integrated semiconductor memory 100 is driven for test purposes by a tester which generally prescribes an external clock signal with a low frequency, a small signal/noise ratio and a low frequency and phase stability, then the tester programs the control bit with the second state in the storage register 21 via the control terminal S100. As a result, for the use of the integrated semiconductor memory in a computer application, use is made of the first clock circuit 11 for the generation of the internal clock signal and, for test purposes, the second clock circuit 12 for the generation of the internal clock signal Cint.

FIG. 2 shows a second embodiment of an integrated semiconductor memory for generating the internal clock signal Cint. The integrated semiconductor memory has a clock generator circuit 10 connected, via a first input terminal E10a, to a clock terminal T100a for application of an external clock signal Cext and, via a second input terminal E10b, to a clock terminal T100b for application of a sensitivity level Vref. The clock generator circuit 10 has the first clock circuit 11 already described in FIG. 1 and the second clock circuit 12, the first clock circuit 11 having a shorter sensitivity time TE than the second clock circuit 12. In order to generate the internal clock signal Cint at the output terminal A10 of the clock generator circuit 10, it is possible optionally to activate the first clock circuit 11 or the second clock circuit 12. The activation of the first or second clock circuit is effected by driving the clock generator circuit 10 with a first or second state of a control signal S generated by the control circuit 20.

The control circuit 20 has an evaluation circuit 22, to which the external clock signal Cext can be fed via a control terminal S100. The evaluation circuit 22 is designed in such a way that it evaluates the signal/noise ratio of the external clock signal Cext and/or the frequency and/or frequency and phase stability of the external clock signal Cext. In this case, the evaluation circuit 22 compares for example the signal/noise ratio and/or the frequency and/or the frequency and phase stability with threshold values of the signal/noise ratio and/or of the frequency and/or of the frequency and phase stability. If the signal/noise ratio and/or the frequency and/or the frequency and phase stability of the external clock signal lies above the respective threshold value, then the control circuit generates the control signal S with the first state on the output side. If, by contrast, the signal/noise ratio and/or the frequency and/or the frequency and phase stability detected by the evaluation circuit 22 lies below the respective threshold value, the control circuit 20 generates the control signal S with the second state.

For generating the internal control clock Cint, the clock generator circuit 10 activates the first clock circuit 11 with the shorter sensitivity time if it is driven with the first state of the control signal S by the control circuit 20. If it is driven with the second state of the control signal S, it activates the second clock circuit with the longer sensitivity time TE. In this case, the integrated semiconductor memory 100 is driven by a poorer-quality external clock signal, for example a clock signal generated by a test system with a small signal/noise ratio and/or a low frequency and/or a low frequency and phase stability. Upon the activation of the first clock circuit with the comparatively shorter sensitivity time, the integrated semiconductor memory 100 is driven, for example by a memory controller in a computer application, by an external clock signal with a comparatively large signal/noise ratio and/or a comparatively high frequency and/or a comparatively high frequency and phase stability. In this case, the clock generator circuit reacts more sensitively to fluctuations of the level of the external control signal.

FIG. 3 shows a third embodiment of an integrated semiconductor memory for generating the internal clock signal Cint. The integrated semiconductor memory has a control circuit 20, to which an external clock signal CLK can be fed via a first control terminal S100a and a complementary external clock signal /CLK with respect thereto can be fed via a second control terminal S100b.

In the embodiment of FIG. 3, then, the control circuit 20 is driven by an external clock signal comprising two individual signals exhibiting mutually complementary behavior. The control circuit 20 has the evaluation circuit 22—already described in FIG. 2—for evaluating the signal/noise ratio and/or the frequency and/or the frequency and phase stability of the external clock signal.

Figure 6:
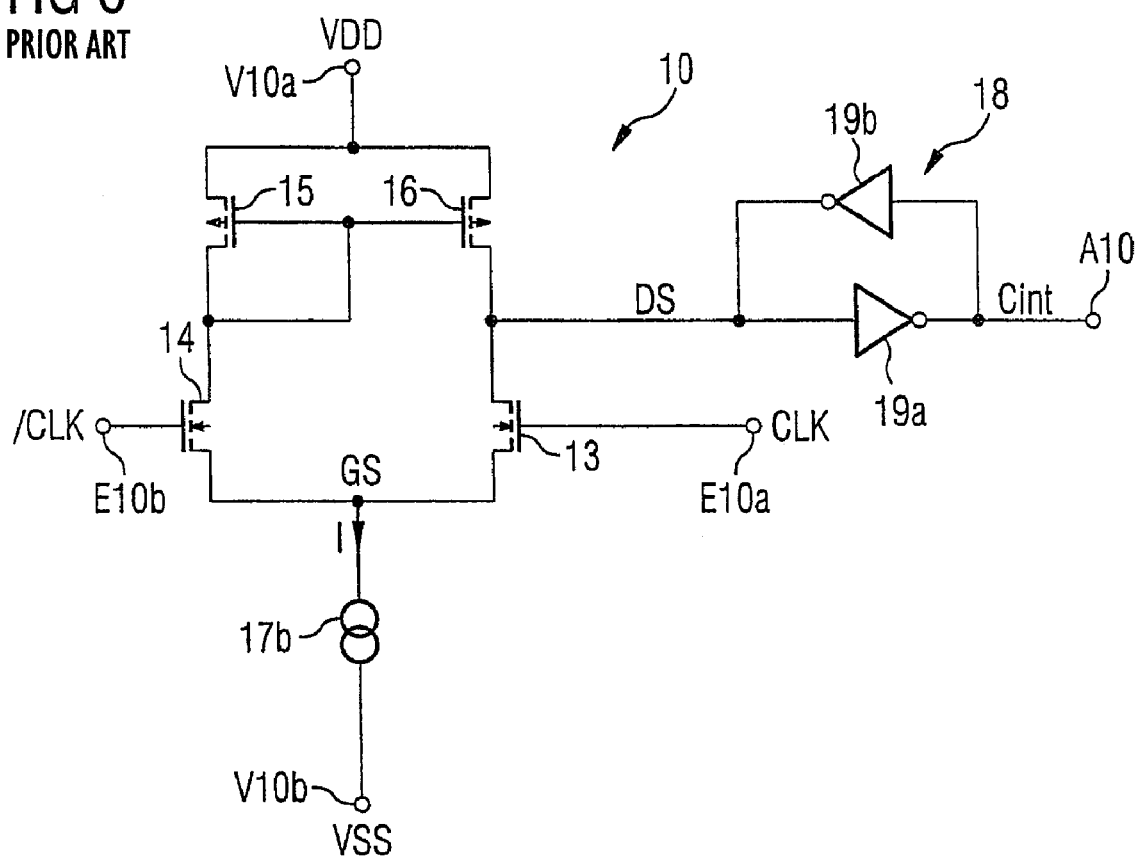
FIG. 6 shows an embodiment of a clock generator circuit for generating an internal clock signal according to the prior art.

The clock generator circuit 10 is connected, via a first input terminal E10a, to a first clock terminal T100a for application of the external clock signal CLK and, via a second input terminal E10b, to a second clock terminal T100b of the integrated semiconductor memory for application of the complementary clock signal /CLK. Consequently, the clock generator circuit 10 is also driven by an external clock signal formed from the two mutually complementary signal components CLK and /CLK. The clock generator circuit 10 is connected, via a first terminal V10a, to a terminal V100a of the integrated semiconductor memory for application of a supply voltage VDD and, via a second terminal V10b, to a terminal V100b of the integrated semiconductor memory for application of a reference voltage VSS. The clock generator circuit 10 is designed as a differential amplifier 10a. In this case, the differential amplifier comprises the input transistors 13 and 14 already described in FIG. 6, the control terminals of which are connected to the input terminals E10a and E10b, and also the transistors 15 and 16 connected as a current mirror. In contrast to the embodiment of FIG. 6, the differential amplifier 10a has a controlled current source between the common terminal GS of the two input transistors 13 and 14 and the terminal V10b, said controlled current source being embodied as a controllable resistor 17a in a simple embodiment. The controlled current source 17a can be controlled by the control signal S generated by the control circuit 20.

If the evaluation circuit 22 is driven by an external clock signal CLK and /CLK with a small signal/noise ratio and/or a low frequency and/or a low frequency and phase stability, it drives the controllable current source 17a by means of the control signal S in such a way that the current I made available to the differential amplifier 10a by the controlled current source decreases. For this purpose, by way of example, the resistance of the controllable resistor 17a is increased. On account of the smaller current fed into the differential amplifier 10a by the controllable current source 17a, said differential amplifier has a lower sensitivity toward level fluctuations of the external clock signal. It reacts for example to a level of the external clock signal below the sensitivity threshold Vref only when the level lies below the sensitivity level for a long time. Undesired level changes in the internal clock signal Cint on account of momentary fluctuations of a noisy external clock signal above or below the sensitivity level Vref are thereby avoided.

If, by contrast, the evaluation circuit 22 is driven by external clock signals CLK and /CLK with a large signal/noise ratio and/or a high frequency and/or a high frequency and phase stability, then it drives the controllable current source 17a in such a way that the current I fed into the differential amplifier 10a is increased. The differential amplifier 10a thus has a higher sensitivity toward fluctuations of the external clock signal. By virtue of its short sensitivity time, it therefore already reacts if the level of the external clock signal Cext momentarily lies below or above the sensitivity level Vref.

LIST OF REFERENCE SYMBOLS

10 Clock generator circuit
11, 12 Clock circuits
20 Control circuit
21 Storage unit
22 Evaluation circuit
30 Control circuit
40 Memory cell array
15, 16 Current mirror transistors
13, 14 Input transistors
17a Controlled current source
18 Latch
19 Inverter
Cext External clock signal
Cint Internal clock signal
Vref Reference signal
SB Control signal
AS Address signal
S Control signal
E Input terminal
A Output terminal
DIO Data input and output terminal
100 Integrated semiconductor memory
CLK Clock signal
/CLK Complementary clock signal
VDD Supply voltage
VSS Reference voltage DS Differential signal
PE Level of the external clock signal
PI Level of the internal clock signal
TE Sensitivity time
TD Pulse duration
BL Bit line
WL Word line
SZ Memory cell
AT Selection transistor
SC Storage capacitor

The invention claimed is:

1. An integrated semiconductor device, comprising:
a clock generator circuit driven by an external clock signal that assumes an external clock level signal, wherein the clock generator circuit generates an internal clock signal with a first level in response to the external clock signal level lying above a sensitivity level of the clock generator circuit for at least the duration of a sensitivity time of the clock generator circuit, and generates the internal clock signal with a second level in response to the external clock signal level lying below the sensitivity level for at least the duration of the sensitivity time of the clock generator circuit, the clock generator circuit including a first clock circuit and a second clock circuit, the first clock circuit having a shorter sensitivity time than the second clock circuit; and
a control circuit driven by an external control signal and controlling the clock generator circuit such that the control circuit selects the sensitivity time of the clock generator circuit in response to the state of the external control signal, wherein the clock generator circuit generates the internal clock signal via one of the first and second clock circuits in dependence on the sensitivity time selected by the control circuit.

2. The integrated semiconductor device of claim 1, wherein:
the control circuit selects a first sensitivity time of the clock generator circuit in response to being driven by a first state of the external control signal and selects a second sensitivity time of the clock generator circuit that is longer than the first sensitivity time in response to being driven by a second state of the external control signal.

3. The integrated semiconductor device of claim 2, wherein:
the control circuit includes a storage unit for storing a control bit; and
the control circuit stores the control bit with a first state in the storage unit when the control circuit is driven by the first state of the external control signal, and stores the control bit with a second state in the storage unit if the control circuit is driven by the second state of the external control signal.

4. The integrated semiconductor device of claim 3, wherein:
the control circuit drives the clock generator circuit with a first state of the control signal in response to having stored the control bit with a first state, and drives the clock generator circuit with a second state of the control signal in response to having stored the control bit with a second state; and
the clock generator circuit generates the internal clock signal via the first clock circuit in response to being driven by the first state of the control signal, and generates the internal clock signal via the second clock circuit in response to being driven by the second state of the control signal.

5. A method for generating a clock signal for operating an integrated semiconductor device, comprising:
providing an integrated semiconductor device that is drivable by an external clock signal that assumes an external clock signal level;
providing the integrated semiconductor device with a first clock circuit having a first sensitivity time and a sensitivity level, wherein the first clock circuit generates an internal clock signal with a first level in response to the external clock signal level lying above the sensitivity level of the first clock circuit for at least the duration of the first sensitivity time, and generates the internal clock signal with a second level in response to the external clock signal level lying below the sensitivity level of the first clock circuit for at least the duration of the first sensitivity time;
providing the integrated semiconductor memory with a second clock circuit having a sensitivity level and a second sensitivity time that is greater than the first sensitivity time, wherein the second clock circuit generates the internal clock signal with the first level in response to the external clock signal level lying above the sensitivity level of the second clock circuit for at least the duration of the second sensitivity time, and generates the internal clock signal with the second level in response to the external clock signal level lying below the sensitivity level of the second clock circuit for at least the duration of the second sensitivity time;
activating the first clock circuit to generate the internal clock signal in response to driving the integrated semiconductor device with an external clock signal having a quality that exceeds a threshold; and
activating the second clock circuit to generate the internal clock signal in response to driving the integrated semiconductor device with an external clock signal having a quality below a threshold.

6. The method of claim 5, wherein the quality includes at least one of: signal/noise ratio, frequency, and frequency and phase stability.

7. An integrated semiconductor device, comprising:
a clock generator circuit driven by an external clock signal that assumes an external clock level signal, wherein the clock generator circuit generates an internal clock signal with a first level in response to the external clock signal level lying above a sensitivity level of the clock generator circuit for at least the duration of a sensitivity time of the clock generator circuit, and generates the internal clock signal with a second level in response to the external clock signal level lying below the sensitivity level for at least the duration of the sensitivity time of the clock generator circuit; and
a control circuit configured to receive the external clock signal and to control the sensitivity time of the clock generator circuit in response to a quality of the external clock signal.

8. The integrated semiconductor device of claim 7, wherein the control circuit controls the clock generator circuit to generate the internal clock signal with a first sensitivity time in response to receiving the external clock signal with a frequency above a threshold value and controls the clock generator circuit to generate the internal clock signal with a second sensitivity time longer than the first sensitivity time in response to receiving the external clock signal with a frequency below the threshold value.

9. The integrated semiconductor device of claim 7, wherein the control circuit controls the clock generator circuit to generate the internal clock signal with a first sensitivity time in response to receiving the external clock signal with a signal/noise ratio above a threshold value and controls the clock generator circuit to generate the internal clock signal with a second sensitivity time longer than the first sensitivity time in response to receiving the external clock signal with a signal/noise ratio below the threshold value.

10. The integrated semiconductor device of claim 7, wherein the control circuit controls the clock generator circuit to generate the internal clock signal with a first sensitivity time in response to receiving the external clock signal with a frequency stability and phase stability above threshold values and controls the clock generator circuit to generate the internal clock signal with a second sensitivity time longer than the first sensitivity time in response to receiving the external clock signal with a frequency stability and phase stability below the threshold values.

11. The integrated semiconductor device of claim 7, wherein:
the clock generator circuit includes a differential amplifier that includes: a first input transistor, a second input transistor, and a controllable current source connected to a common terminal of the first and second input transistors; and
the controllable current source generates a first current at the common terminal of the first and second input transistors in response to the control circuit receiving the external clock signal whose quality is greater than a threshold value and generates a second current at the common terminal of the first and second input transistors that is lower than the first current in response to the control circuit receiving the external clock signal whose quality is less than the threshold level.

12. The integrated semiconductor device of claim 7, wherein the quality includes at least one of: signal/noise ratio, frequency, and frequency and phase stability.

13. The integrated semiconductor device of claim 7, wherein the clock generator circuit includes a first clock circuit and a second clock circuit, the first clock circuit having a shorter sensitivity time than the second clock circuit.

14. The integrated semiconductor device of claim 13, wherein the clock generator circuit generates the internal clock signal via the first clock circuit in response to the control circuit receiving the external clock signal with a first quality and generates the internal clock signal via the second clock circuit in response to the control circuit receiving the external clock signal with a second quality that is poorer than the first quality.

15. The integrated semiconductor device of claim 7, wherein the control circuit controls the clock generator circuit with a first state of a control signal in response to receiving the external clock signal whose quality is greater than a threshold value, and controls the clock generator circuit with a second state of the control signal in response to receiving the external clock signal whose quality is less than the threshold value.

16. The integrated semiconductor device of claim 15, wherein:
the control circuit includes a storage unit for storing a control bit; and
the control circuit drives the clock generator circuit with the first state of the control signal in response to the control bit having a first state, and drives the clock generator circuit with the second state of the control signal in response to the control bit having a second state.

17. The integrated semiconductor device of claim 15, wherein the control circuit includes an evaluation circuit that evaluates the external clock signal and generates the control signal with the first state in response to receiving the external clock signal whose quality is greater than a threshold value, and generates the control signal with the second state in response to receiving the external clock signal whose quality is less than the threshold value.

18. The integrated semiconductor device of claim 17, wherein the evaluation circuit evaluates the frequency of the external clock signal.

19. The integrated semiconductor device of claim 17, wherein the evaluation circuit evaluates the signal/noise ratio of the external clock signal.

20. The integrated semiconductor device of claim 17, wherein the evaluation circuit evaluates the frequency stability and phase stability of the external clock signal.

21. A method for generating a clock signal for operating an integrated semiconductor device, comprising:
providing the integrated semiconductor device with a clock generator circuit comprising a differential amplifier with a controllable current source for generating a current that is fed into the differential amplifier;
driving the integrated semiconductor device with an external clock signal;
evaluating the frequency of the external clock signal;
supplying a first current from the controllable current source to the differential amplifier in response to the frequency of the external clock signal lying above a frequency threshold; and
supplying a second current from the controllable current source to the differential amplifier in response to the frequency of the external clock signal lying below the frequency threshold, wherein the second current is less than the first current.

* * * * *